(12) United States Patent
Lim et al.

(10) Patent No.: US 11,202,367 B2
(45) Date of Patent: Dec. 14, 2021

(54) FLEXIBLE CIRCUIT BOARD

(71) Applicant: LG INNOTEK CO., LTD., Seoul (KR)

(72) Inventors: Jun Young Lim, Seoul (KR); Woong Sik Kim, Seoul (KR); Hyung Kyu Yoon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/688,476

(22) Filed: Nov. 19, 2019

(65) Prior Publication Data

US 2020/0107440 A1 Apr. 2, 2020

Related U.S. Application Data

(63) Continuation of application No. 15/765,308, filed as application No. PCT/KR2016/010300 on Sep. 12, 2016, now Pat. No. 10,517,172.

(30) Foreign Application Priority Data

Oct. 6, 2015 (KR) .................. 10-2015-0140252

(51) Int. Cl.
*H05K 1/09* (2006.01)
*H05K 1/02* (2006.01)
(Continued)

(52) U.S. Cl.
CPC ............... *H05K 1/09* (2013.01); *H05K 1/028* (2013.01); *H05K 1/0393* (2013.01); *H05K 3/28* (2013.01);
(Continued)

(58) Field of Classification Search
CPC ........ H05K 1/09; H05K 3/3452; H05K 1/028; H05K 1/0393; H05K 3/28; H05K 1/18;
(Continued)

(56) References Cited

U.S. PATENT DOCUMENTS

| 4,675,786 A | 6/1987 | Mizuko |
| 5,634,268 A | 6/1997 | Dalal |

(Continued)

FOREIGN PATENT DOCUMENTS

| CN | 102315195 | 1/2012 |
| JP | 2012-019210 | 1/2012 |

(Continued)

OTHER PUBLICATIONS

International Search Report (with English Translation) and Written Opinion dated Dec. 29, 2016 issued in Application No. PCT/KR2016/010300.

(Continued)

*Primary Examiner* — Ishwarbhai B Patel
(74) *Attorney, Agent, or Firm* — KED & Associates LLP

(57) ABSTRACT

An embodiment of the present invention relates to a flexible printed circuit board (FPCB), which is applied to various electronic display devices, and may provide the FPCB, including a base, a first metal layer and a second metal layer on both surfaces of the base, a first plating layer on the first metal layer, a second plating layer on the second metal layer, and a first insulating pattern and a second insulating pattern respectively disposed on some region of the first plating layer and the second plating layer, wherein the first plating layer and the second plating layer may have different thicknesses.

20 Claims, 3 Drawing Sheets

(51) Int. Cl.
　　　*H05K 1/18*　　　(2006.01)
　　　*H05K 3/34*　　　(2006.01)
　　　*H05K 3/28*　　　(2006.01)
　　　*H05K 1/03*　　　(2006.01)
　　　*H05K 3/24*　　　(2006.01)

(52) U.S. Cl.
　　　CPC ............. *H05K 3/3452* (2013.01); *H05K 1/18* (2013.01); *H05K 1/189* (2013.01); *H05K 3/244* (2013.01); *H05K 2201/0154* (2013.01); *H05K 2201/0191* (2013.01); *H05K 2201/0338* (2013.01); *H05K 2201/10136* (2013.01)

(58) Field of Classification Search
　　　CPC ................... H05K 1/189; H05K 3/244; H05K 2201/0191; H05K 2201/0338; H05K 2201/10136; H05K 2201/0154
　　　See application file for complete search history.

(56) References Cited

U.S. PATENT DOCUMENTS

| | | | |
|---|---|---|---|
| 8,067,697 | B2 | 11/2011 | Lee et al. |
| 2005/0167803 | A1* | 8/2005 | Imamura ............. G02F 1/13452 257/678 |
| 2006/0163718 | A1 | 7/2006 | Kurihara |
| 2006/0220242 | A1 | 10/2006 | Kawamura |
| 2006/0268530 | A1* | 11/2006 | Nagao ..................... H05K 1/028 361/749 |
| 2010/0165657 | A1 | 7/2010 | Lee et al. |
| 2013/0062102 | A1 | 3/2013 | Lee |
| 2014/0118969 | A1* | 5/2014 | Lee ..................... H01L 23/4985 361/749 |
| 2014/0254111 | A1* | 9/2014 | Yamazaki ............ G04G 9/0088 361/749 |

FOREIGN PATENT DOCUMENTS

| | | |
|---|---|---|
| KR | 10-0641781 | 11/2006 |
| KR | 10-0816843 | 3/2008 |
| KR | 10-2010-0077821 | 7/2010 |
| KR | 10-1235701 | 2/2013 |
| KR | 10-2014-0117891 | 10/2014 |
| KR | 10-1547500 | 8/2015 |

OTHER PUBLICATIONS

Chinese Office Action dated Sep. 24, 2019 issued in CN Application No. 201680058226.4.

* cited by examiner

FLEXIBLE CIRCUIT BOARD

CROSS-REFERENCE TO RELATED PATENT APPLICATIONS

This application is a Continuation of U.S. application Ser. No. 15/765,308, filed Apr. 2, 2018, which is a U.S. National Stage Application under 35 U.S.C. § 371 of PCT Application No. PCT/KR2016/010300, filed Sep. 12, 2016, which claims priority to Korean Patent Application No. 10-2015-0140252, filed Oct. 6, 2015, whose entire disclosures are hereby incorporated by reference.

TECHNICAL FIELD

An embodiment of the present invention relates to a flexible printed circuit board (FPCB), which is applied to various electronic display devices.

BACKGROUND ART

A chip on film (COF) base applied to an electronic device such as a flat panel display such as an LCD or a mobile device performs a function of allowing a circuit chip and a circuit wiring to be disposed in a region where bending is performed due to flexible characteristics. Such a COF base may increase a degree of freedom in a design of electronic devices and is widely used for various shapes and structures of bent electronic devices.

However, in the COF base, cracks may occur in a process of a repeated bending action or coupling in a bent state of a circuit pattern formed on a base film, or a problem that a metal pattern layer may be broken due to a tensile force generated at the time of bending the circuit pattern may occur.

Referring to FIG. 1, FIG. 1 is a view of an example of application to a product in which a COF base is used. As shown in FIG. 1, a COF base 3 is used to constitute a device including a display panel 1. That is, the COF base 3 may function to electrically connect the display panel 1 and a FPCB 2, and may be bent and connected as shown in FIG. 1 in order to secure a space inside a device. In this case, an IC chip 4 may be further mounted on the COF base 3.

In such a structure, recently, as the display panel requires a high resolution, a number of channels required for the COF base 3 is increasing. Accordingly, there is an increase in demand for a double-sided COF having circuit wiring patterns on both sides of a flexible board, not a conventional single-sided COF base.

In the case of the double-sided COF, the circuit wiring pattern should be thinly formed on the both sides of the flexible board, and accordingly, cracks due to bending, may occur in a portion 3a where the bending is performed when the double-sided COF base constitutes a device including the display.

DISCLOSURE

Technical Problem

Embodiments of the present invention is directed to solving the above-described problems, and a flexible printed circuit board (FPCB) which may be applied to a bent coupling structure is implemented, in particular, a thickness of a plating layer formed on each of circuit patterns of upper and lower surfaces is made different, and a position of a protective layer for protecting the plating layer is implemented in a buried structure, so that a crack phenomenon may be prevented, which is caused by a change in a tensile force at the time of bending and also generation of particles may be reduced remarkably, which is generated in a plating process, thereby providing the FPCB capable of enhancing reliability of a product.

In particular, it is possible to eliminate a problem that a circuit wiring pattern formed on the FPCB is damaged by cracks and the double-sided COF base does not play its original role.

Technical Solution

As a means for solving the above-described problems, according to an embodiment of the present invention, there is provided a flexible printed circuit board (FPCB), including a base, a first metal layer and a second metal layer on both surfaces of the base, a first plating layer on the first metal layer, a second plating layer on the second metal layer, and a first insulating pattern and a second insulating pattern respectively disposed on some region of the first plating layer and the second plating layer, wherein the first plating layer and the second plating layer may have different thicknesses.

Advantageous Effects

According to an embodiment of the present invention, a flexible printed circuit board (FPCB) which may be applied to a bent coupling structure is implemented, in particular, a thicknesses of a plating layer formed on each of circuit patterns of upper and lower surfaces is made different, and a position of a protective layer for protecting the plating layer is implemented in a buried structure, so that a crack phenomenon may be prevented, which is caused by a change in a tensile force at the time of bending and also generation of particles may be reduced remarkably, which is generated in a plating process, thereby being an effect capable of enhancing reliability of a product.

MODES OF THE INVENTION

Figure 1:
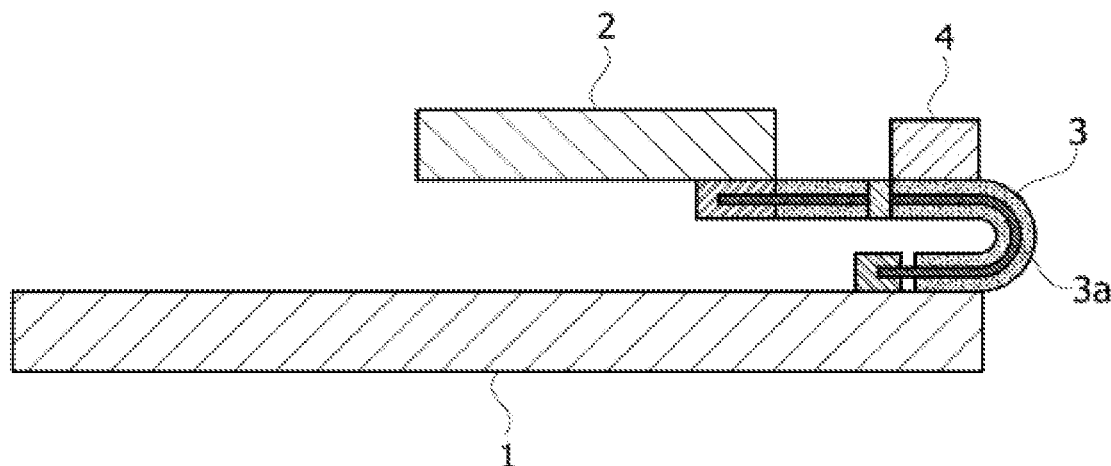
FIG. 1 is a conceptual diagram illustrating an example of a device to which a general COF is applied.

Hereinafter, a configuration and action according to the present invention will be described in detail with reference to accompanying drawings. In the following description with reference to the accompanying drawings, the same components are designated by the same reference numerals regardless of the reference numerals, and redundant description thereof will be omitted. Although terms such as first, second, etc. can be used to describe various components, the above-mentioned components should not be limited by the above terms. The terms are only used to distinguish one component from another.

Figure 2:
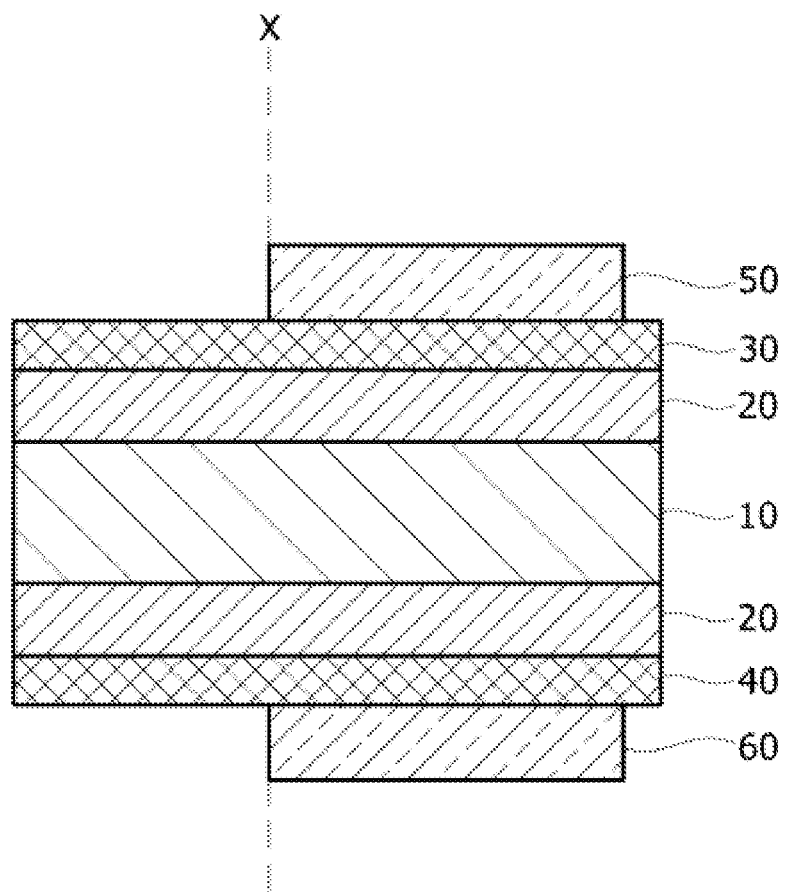
FIG. 2 is a view of a general double-sided flexible printed circuit board (FPCB).
Figure 3:
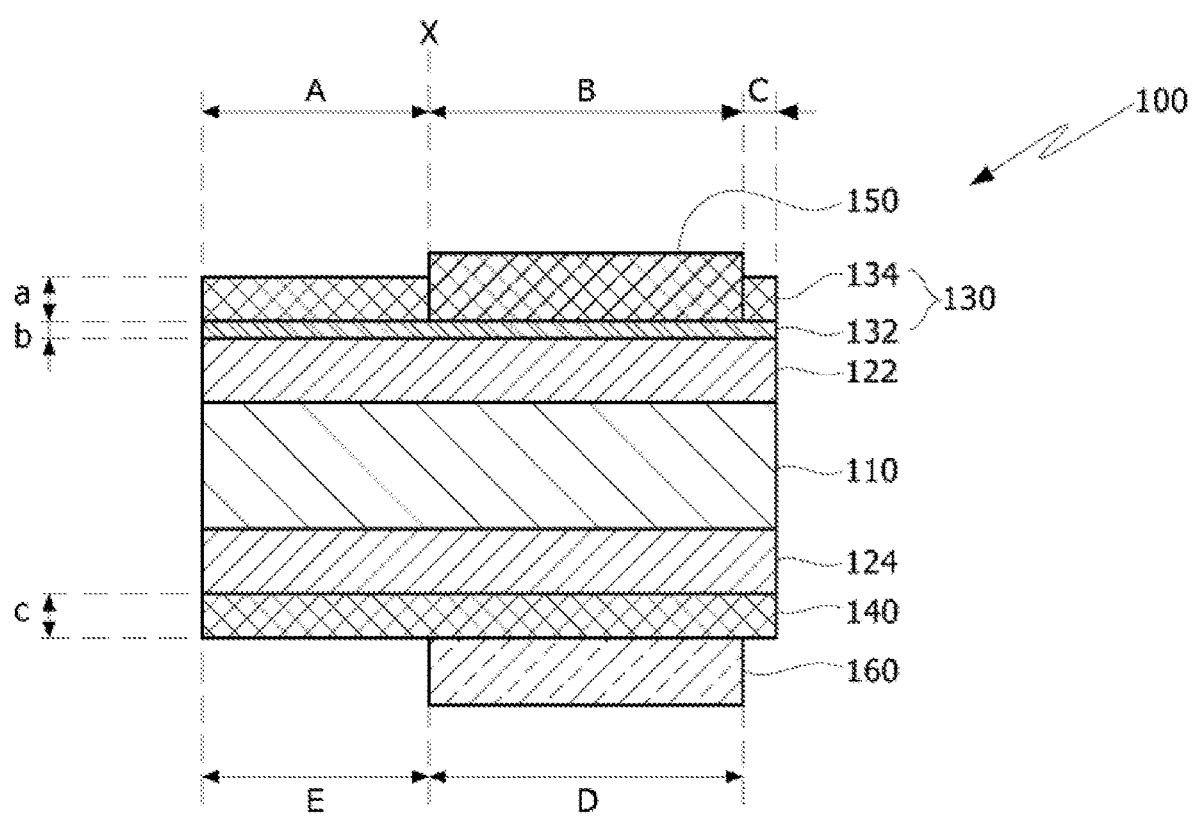
FIG. 3 is a conceptual cross-sectional view illustrating a structure of a FPCB according to an embodiment of the present invention.

FIG. 2 is a comparative view for comparison with a flexible printed circuit board (FPCB) according to an embodiment of the present invention, and is a conceptual diagram of a structure of which a plating layer is formed on a double-sided FPCB, and FIG. 3 is a conceptual cross-sectional view illustrating a structure of a FPCB according to an embodiment of the present invention.

Referring to FIG. 2, the FPCB according to a structure of FIG. 2, is an example of a structure in which a metal layer 20 is disposed on both surfaces of a base 10 at a center portion, solder-resist layers 50 and 60 are respectively implemented on an upper portion thereof, and plating layers 30 and 40 having a uniform thickness are further laminated on the metal layer 20. In such a structure of FIG. 2, when the FPCB is bent with center on a bending reference line X formed on one side of the solder-resist layers 50 and 60, tensile strengths of the plating layer and the metal layer disposed at upper and lower portions act differently from each other, so that cracks easily occur.

Referring to FIG. 3, a FPCB 100 according to an embodiment of the present invention may include a base 110, a first metal layer 122 and a second metal layer 124 on both surfaces of the base 110, and a first plating layer 130 disposed on the first metal layer 122 in a laminated structure and a second plating layer 140 formed on the second metal layer 124. In particular, in this case, there is provided the FPCB, including a first insulating pattern 150 and a second insulating pattern 160 respectively disposed on some region of the first plating layer 130 and the second plating layer 140, wherein the first plating layer 130 and the second plating layer 140 have a structure of regions with different thicknesses.

That is, in the structure of the FPCB according to an embodiment of the present invention, the first metal layer 122 and the second metal layer 124 constituting a circuit pattern on the base 110 are provided, and a plating layer is implemented thereon in order to improve signal characteristics and protect the circuit pattern through a laminating process such as a plating. A thickness of the plating layer formed on an upper portion surface of the metal layer, that is, the thickness of the first plating layer 130 may be different from that of the second plating layer 140 on a lower portion surface. A thickness of some region of the first plating layer 130 may be implemented thicker than that of the second plating layer 140. Accordingly, later, when the FPCB is mounted on an electronic device in a bent structure, the thickness of the plating layer may be implemented thicker with reference to the boundary line X at which the bending is performed. That, is, a stiffness is added to a portion where a change of a tensile force is relatively small, and a degree of stiffness is reduced on an opposite side where a change of a tensile force is relatively large, so that a change in a tensile force of the circuit pattern may be buffered as a whole. Therefore, generation of cracks may be reduced remarkably in the first metal layer and the second metal layer implementing the circuit pattern as well as the first plating layer and the second plating layer.

Further, as in the structure of FIG. 3, in an embodiment of the present invention, the insulating patterns 150 and 160 for protecting patterns may be disposed on surfaces of each of the first and second plating layers 130 and 140. In this case, the first insulating pattern 150 and the second insulating pattern 160 respectively disposed on some region of the first plating layer 130 and the second plating layer 140, may be disposed on only some region of the first plating layer 130 and the second plating layer 140 which are to be partially exposed. In particular, the first insulating pattern 150 and the second insulating pattern 160 are disposed in a range not overlapped with the boundary line X where the bending is performed, so that cracks of the insulating pattern at the time of bending may be prevented.

Furthermore, the first insulating pattern 150 may be implemented in a structure buried at a predetermined depth from a surface of the first plating layer 130. That is, a side surface portion of the first insulating pattern 150 may be in contact with a side surface portion of the first plating layer 130. A predetermined portion of the first insulating pattern 150 may be implemented in a structure buried in the first plating layer 130. Accordingly, the FPCB according to an embodiment may have structural stability. Meanwhile, the FPCB according to an embodiment may expand ductility of the insulating pattern at the time of bending to a predetermined portion at the boundary line X where the bending is performed, so that a stress may be buffered. Therefore, generation of cracks may be prevented in the circuit pattern and the plating pattern disposed on an upper portion surface thereof. In addition, the first insulating pattern 150 and the second insulating pattern 160 may be disposed at a portion 3a where the bending is performed at the time of constituting a device. Accordingly, generation of cracks caused by bending of the FPCB may be reduced.

Specifically, the first plating layer 130 according to an embodiment of the present invention may be composed of a first region B corresponding to a lower portion of the first insulating pattern 150 and a second regions A and C which are regions other than the region where the first insulating pattern 150 is disposed. And, the second plating layer 140 according to an embodiment of the present invention may be composed of a third region D corresponding to an upper portion of the second insulating pattern 160 and a fourth region E which are regions other than the third region where the second insulating pattern 160 is disposed. The first region B and third region D may be a region where bending is performed. For example, according to an embodiment, when the FPCB is used to constitute a device including a display panel, a cross section of the first region B and the third region D may have a curved shape. The first region B and the third region D may refer to a region where the upper surface (a portion of the upper surface) of the base and the upper surface (another portion of the upper surface) are bent and face each other, or the lower surface (a portion of the lower surface) of the base and the lower surface (another portion of the lower surface) face each other.

The second regions A and C may be regions other than the region where bending is performed. For example, when the FPCB according to an embodiment is used to constitute a device including a display panel, a cross section of the second regions A and C may have a straight line shape. The second regions A and C may include regions where the base is partially bent to connect with a display panel or a separate circuit board. That is, the second regions A and C may be regions where one surface (a portion of one surface) of the board and one surface (another portion of one surface) do not face each other.

A thickness of the first plating layer 130 in the second regions A and C may be greater than that of the first plating layer 130 in the first region B. Accordingly, the first insulating pattern 150 may have a structure buried in the first plating layer 130 in the first region B. Therefore, the first insulating pattern 150 may buffer a tensile force by structural characteristics, and may control a difference in a tensile force applied to upper and lower portion surfaces of the base, thereby reducing generation of cracks.

In addition, as shown in FIG. 3, the first plating layer 130 according to an embodiment of the present invention may be distinguished into a first sub-plating layer 132 in direct contact with the first metal layer 122 and a second sub-plating layer 134 having a thickness that allows the first insulating pattern 150 to be buried therein. In particular, in the case of the second sub-plating layer 134, the second sub-plating layer 134 may be implemented with substantially the same thickness as that of the second plating layer 140 disposed on a lower portion surface of the base 110.

The first sub-plating layer 132 may include an alloy structure due to action occurring on the surface of the first metal layer 122. In addition, the second plating layer 140 may include an alloy structure due to action occurring on the surface of the second metal layer 124.

For example, when the first metal layer 122 and the second metal layer 124 are implemented with Cu and the first sub-plating layer 132 and the second plating layer 140 are plated with Sn, the first sub-plating layer 132 and the second plating layer 140 may be implemented with a structure including a Cu/Sn-based alloy by a chemical action at a laminating interface. That is, a material of a portion corresponding to a thickness of the first region of the first plating layer and a material of the second plating layer may be implemented as the same to each other.

On the other hand, materials of the first sub-plating layer 132 and the second sub-plating layer 134 may be implemented differently from each other. That is, in an embodiment of the present invention, it is advantageous for convenience of the process that the first plating layer and the second plating layer are plated with the same material, but, in order to implement a unique structure of the present invention, materials of the first sub-plating layer 132 and the second sub-plating layer 134 may be implemented differently from each other in the process of plating the first plating layer twice. More specifically, the first sub-plating layer and the second sub-plating layer may have different contents of the same alloy material with each other.

As described above, the difference between the materials of the first sub-plating layer and the second sub-plating layer is implemented through the following process. In the manufacturing process of FIG. 3, after the first metal layer and the second metal layer are formed of a Cu material, in a structure in which the first sub-plating layer 132 is plated with Sn, the first insulating pattern 150 is coated, the second sub-plating layer 134 and the second plating layer 140 are plated, and the second insulating pattern 160 is coated, when a heat treatment process including thermal curing is performed, a diffusing action of Cu and Sn occurs. In particular, in this case, a part of Sn of the first sub-plating layer 132 and the second sub-plating layer 134 and a part of Cu of the first metal layer 122 may be diffused to form an alloy. A concentration of diffusion of Cu may be continuously lowered as toward a surface of the second sub-plating layer 134 from the first sub-plating layer 132, and a concentration of diffusion of Sn may be lowered as toward the first metal layer 122 from the surface of the second sub-plating layer 134.

In addition, a part of Sn of the second plating layer 140 and a part of Cu of the second metal layer 124 may be diffused to form an alloy, a concentration of diffusion of Cu may be continuously lowered as toward a surface of the second plating layer 140 from the second metal layer 124, and a concentration of diffusion of Sn may be lowered as toward the second metal layer 124 from the surface of the second plating layer 140. That is, a content of a material of each layer is different. An electrochemical migration resistance may be prevented by such a diffusion phenomenon of Cu/Sn, and thus a short-circuit defect due to metal growth can be prevented.

A thickness (a) of the second sub-plating layer 134 corresponding to the second regions A and C of the first plating layer 130 may be substantially the same as a thickness (c) of the second plating layer 140. Alternatively, a thickness (b) of the first sub-plating layer 132 corresponding to the first region B of the first plating layer 130 may be substantially the same as the thickness of (c) of the second plating layer 140.

That is, a thickness and a shape of the first plating layer may be implemented by distinctiveness of the process of the FPCB according to an embodiment of the present invention.

In the structure of the FPCB, the first insulating pattern 150 and the second insulating pattern 160 may be implemented as a structure in which the first insulating pattern 150 and the second insulating pattern 160 are disposed to face each other with reference to the first region. More specifically, the first insulating pattern 150 and the second insulating pattern 160 may be disposed at positions symmetrical to each other on upper and lower portions of the base 110, or may be disposed as a structure in which the first insulating pattern 150 and the second insulating pattern 160 are partially overlapped with each other. Such a structure may act as a factor capable of adjusting generation of cracks by controlling a tensile force of the FPCB. In an embodiment of the present invention, it is preferable that the first insulating pattern 150 and the second insulating pattern 160 should be disposed within a range not exceeding the reference of the boundary line X of the FPCB.

In addition, since the base 110 according to an embodiment of the present invention is in contact with an acid or the like during etching, the base 110 having chemical resistance which is not eroded by such chemicals and heat resistance which does not deteriorate by heating during coupling, may be used. As an example of resin forming such a base may include glass epoxy, bismaleimide-triazine (BT) resin, polyester, polyamide, polyimide or the like. In particular, in an embodiment of the present invention, it is preferable to use a film made of polyimide. As an example of the polyimide film composing the base may be listed all aromatic polyamides synthesized with pyromellitic dianhydride and aromatic diamine, and all aromatic polyamides having biphenyl skeleton synthesized with biphenyltetracarboxylic dianhydride and aromatic diamine. In particular, in an embodiment of the present invention, all the aromatic polyamides having a biphenyl skeleton may be used.

The first metal layer and the second metal layer may be implemented in various metal material layers made of a conductive metal, and in an embodiment of the present invention, any one of an electrolytic copper foil and a rolled copper foil laminated on the base may be used. The electrolytic copper foil may form a circuit pattern in a fine pitch. In an embodiment of the present invention, the first metal layer and the second metal layer have a comprehensive concept of a structure including various circuit patterns and wiring patterns implemented by patterning (e.g., photolithograph process, etc.) a copper foil layer in addition to a simple metal layer.

Figure 4:
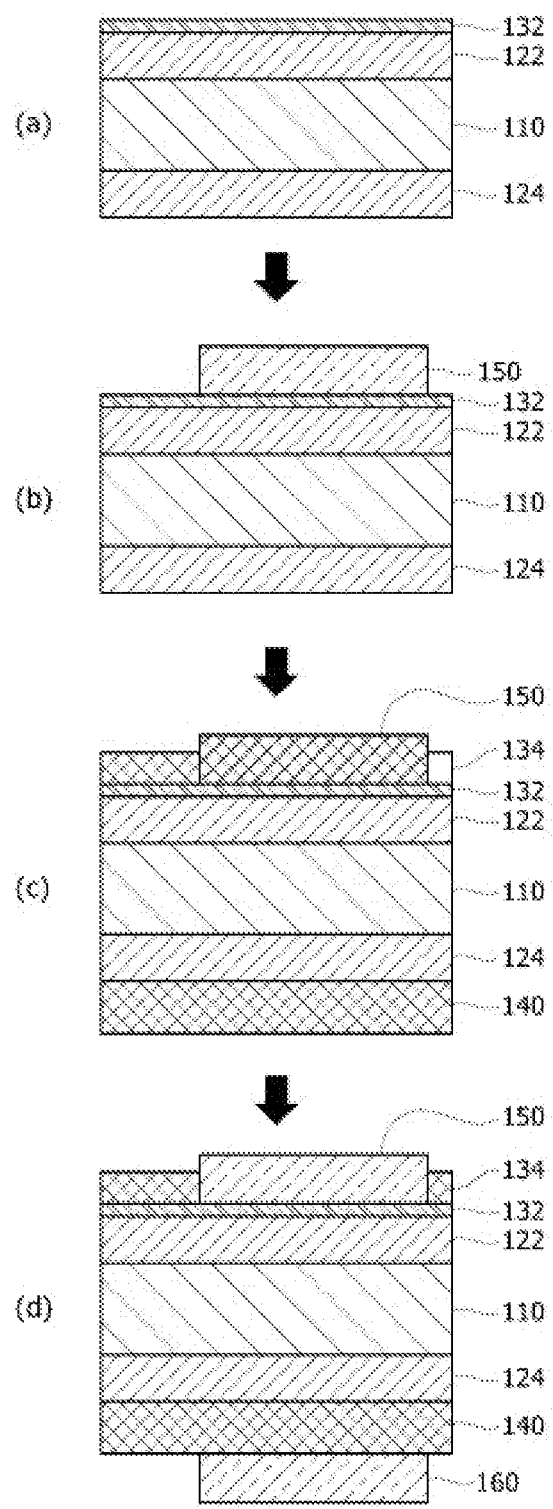
FIG. 4 is a process conceptual diagram illustrating a manufacturing process of a FPCB according to an embodiment of the present invention.

FIG. 4 shows an example of a manufacturing process of a FPCB according to an embodiment of the present invention as described above in FIG. 3.

Referring to FIG. 4, according to an embodiment of the present invention, first, in the process of manufacturing the FPCB of (a), a first sub-plating layer 132 may be formed on an upper portion surface of structures in which a first metal layer 122 and a second metal layer 124 are implemented on both sides of a base 110 via plating.

The base 110 may include a flexible plastic. For example, the base 110 may be a base composed of a polymeric material layer such as polyimide (PI), polyethylene terephthalate (PET), or polyethylene naphthalate (PEN), and in the present embodiment, it will be described as an example that a sheet layer using polyimide (PI) is applied to one embodiment. In the present embodiment, a case in which a thickness of the base 110 is implemented in the range of 12.5 to 125 μm may be applied.

In addition, the first metal layer 122 and the second metal layer 124 may be implemented in a circuit pattern implemented on the base 110, and may have a thickness within the range of 8 to 9 μm. Further, the first metal layer 122 and the second metal layer may be any one of Cu and Al, or various metal layers and alloy layers having conductivity may be used. For example, of course, the first metal layer 122 and the second metal layer 124 may contain at least one metal among copper (Cu), aluminum (Al), chromium (Cr), nickel (Ni), silver (Ag), molybdenum (Mo), gold (Au), titanium (Ti), and alloys thereof. The thickness of the first metal layer 122 and the thickness of the second metal layer 124 may be implemented to be substantially equal to each other, and the thickness thereof may be implemented in the range of 1 to 20 μm.

Further, the first sub-plating layer 132 may be composed of an Sn-plated layer, or may be composed of any one of an Ni/Au alloy, electroless nickel immersion gold (ENIG), Ni/Pd and organic solderability preservative (OSP). In this case, a thickness of the first sub-plating layer 132 may be implemented to be 0.1 μm or less.

Next, in the process of (b), a first insulating pattern 150 is implemented on an upper surface of the first sub-plating layer 132. The first insulating pattern 150 may contain an insulating material. The first insulating pattern 150 may be a resist layer. For example, the first insulating pattern 150 may be a solder resist layer containing an organic polymer material. For example, the first insulating pattern 150 may be implemented in the range of 1 to 20 μm by printing an insulating pattern using a solder resist ink or by applying various materials (cover-lay, polymeric material) having insulation characteristics. As described above, the first insulating pattern 150 is a structure in which a part of a surface of the first sub-plating layer 132 is exposed, and may be implemented in only some region.

Then, in the process (c), both upper and lower surfaces of the structure implemented in the process (b) are plated. Through this, the FPCB is implemented in a structure in which a second sub-plating layer 134 is laminated on the upper portion surface of the first sub-plating layer 132, and a second plating layer 140 is formed in contact with the second metal layer 124. In this case, thicknesses of the second sub-plating layer and the second plating layer may be implemented to be 1 μm or less. In particular, when the first sub-plating layer 132 and the second sub-plating layer 134 are plated with the same material, the first plating layer may be implemented as one layer. However, as described above, in the case of the first sub-plating layer 132 and the second plating layer 140, a predetermined alloy may be formed by interaction between the first metal layer 122 and the second metal layer 124. In addition, the first insulating pattern 150 may be implemented in a structure in which a part of the first insulating pattern 150 is buried in the first plating layer 130 by the plating process. The upper surface of the first insulating pattern 150 may be disposed higher than the upper surface of the second sub-plating layer 134. Accordingly, a side surface of the first insulating pattern 150 may be partially in contact with the second sub-plating layer 134. That is, the side surface of the first insulating pattern 150 may be in contact with the second sub-plating layer 134 in a region corresponding to the thickness of the second sub-plating layer 134.

Next, in the process (d), a second insulating pattern 160 may be disposed on an upper surface of the second plating layer 140. The second insulating pattern 160 may contain an insulating material. The second insulating pattern 160 may be a resist layer. For example, the second insulating pattern 160 may be a solder resist layer containing an organic polymer material. For example, the second insulating pattern 160 may be implemented in a range of 1 to 20 μm by printing an insulating pattern using a solder resist ink or by applying various materials (cover-lay, polymeric material) having insulation characteristics. The second insulating pattern 160 may be disposed at a position where the second insulating pattern 160 and the first insulating pattern 150 are overlapped with each other with center on the base 110. More preferably, it has been described above that the second insulating pattern 160 and the first insulating pattern 150 may be disposed at a position symmetrical to each other. In particular, in an embodiment of the present invention, when the insulating pattern is implemented by the above-described solder resist, a thermal curing process or a drying process may be added.

By this process, the first sub-plating layer 132 and the second plating layer 140 may be made of a material having a predetermined alloy structure by action occurring on the surfaces of the first metal layer 122 and the second metal layer 124, and each layer may be classified into material-changed layers according to a content of alloy in each layer by using an X-ray diffraction method and an AES analysis method.

Hereinafter, results of comparative experiments on bending characteristics of the structure of FIG. 2 and the structure according to an embodiment of the present invention will be described.

The FPCB having the structure of FIG. 2 and the FPCB having the structure of FIG. 3 were formed in the same size. Next, repeated operations of performing bending with center on the bending reference line X as shown in FIGS. 2 and 3 were performed. At this point, the first and second metal layers were formed of Cu, the first and second plating layers were formed of Sn, and the first and second insulating patterns were formed of solder resist.

Based on a configuration of FIG. 3, a polyimide film having a thickness of 35 μm was applied to the base, the first metal layer and the second metal layer were formed of a Cu layer of 8 μm, the first sub-plating layer was formed of Sn layer of 0.05 μm, the second sub-plating layer was formed of Sn layer of 0.4 μm, and the first plating layer is formed to a thickness of 0.45 μm. Further, the second plating layer was formed of Sn of 0.4 μm. Further, the insulating pattern was formed of a solder resist layer having a thickness of 10 μm.

In addition, in the structure of the comparative example shown in FIG. 2, the base 10 was implemented with the polyimide film having the same thickness of 35 μm, and the metal layer 20 on the base was formed of a Cu layer of 8 μm, the plating layers 30 and 40 were formed to have a thickness of 0.45 μm, the insulating pattern 50 and 60 was formed to have a thickness of 10 μm, which were the same standards.

In the case of the structure shown in FIG. 2, cracks were not observed until 10 times of bending, but cracks were generated from 10 times of bending. Accordingly, it was confirmed that reliability of the FPCB of the structure according to the comparative example was lowered.

In the case of the structure according to an embodiment of FIG. 3, it was confirmed that cracks were not generated even at 40 times of bending. It was confirmed that micro cracks were generated when the number of bending was about 50 times. That is, it was confirmed that bending characteristics of the embodiment were improved by about 500% compared with the comparative example of FIG. 2.

This is, as described above, due to a structure in which a difference in tensile force between the upper and lower portions occurs, it clearly shows that the structure in which the tensile force is controlled by the structure according to an embodiment of the present invention is more effective in preventing generation of cracks.

Further, when the structure of FIG. 3 is designed with the same numerical values as in the experimental example, pure tin (Sn) of the second sub-plating layer may be distributed to a range of 0.1 um from a surface of the second sub-plating layer.

Two plating layers may be disposed on at least one surface of the double-sided FPCB. For example, the first sub-plating layer 132 may be disposed under the first insulating pattern 150, and the second sub-plating layer 134 may be disposed on a side surface of the first insulating pattern 150. The first insulating pattern 150 according to an embodiment may have a buried structure in which the first insulating pattern 150 is surrounded by the second sub-plating layer 134 on the first sub-plating layer 132, and thus tensile force may be relieved at the time of bending. Accordingly, an embodiment may prevent cracks or de-filming of the metal layer and/or the plating layer, thereby improving electrical reliability of the FPCB.

In addition, the insulating pattern according to an embodiment may increase an area which is in contact with the plating layer, thereby preventing separation of the insulating pattern. Accordingly, reliability of the FPCB according to an embodiment may be improved.

In addition, in the FPCB according to an embodiment, since the second sub-plating layer 134 is partially disposed on the first metal layer 122, generation of metal particles, for example Sn particles, which are generated in the plating process is reduced, thereby improving reliability of the FPCB and a COF module including the same.

Specific embodiments have been described in the detailed description of the present invention as described above. However, various modifications are possible within a scope of the present invention. The technical idea of the present invention should not be limited to the described embodiments of the present invention but should be determined by the claims and equivalents thereof.

The invention claimed is:

1. A flexible printed circuit board (FPCB), comprising:
a base;
a first metal layer and a second metal layer on respective surfaces of the base;
a first plating layer on the first metal layer;
a second plating layer under the second metal layer;
a first insulating pattern provided on the first plating layer; and
a second insulating pattern under a part of the second plating layer,
wherein the first plating layer includes:
a first region corresponding to a lower portion of the first insulating pattern; and
a second region which differs from the first region,
wherein the second plating layer includes:
a third region corresponding to an upper portion of the second insulating pattern; and
a fourth region which differs from the third region,
wherein the first plating layer includes:
a first sub-plating layer; and
a second sub-planting layer on a first part of the first sub-plating layer,
wherein the first insulating pattern is provided on a second part of the first sub-plating layer,
wherein a thickness of the second region of the first plating layer is greater than a thickness of the first region of the first plating layer,
wherein a thickness of the third region of the second plating layer corresponds to a thickness of the fourth region of the second plating layer, and
wherein a step difference between an upper surface of the second sub-plating layer and an upper surface of the first insulating pattern is smaller than a step difference between a lower surface of the second plating layer and a lower surface of the second insulating pattern.

2. The FPCB of claim 1, wherein an upper surface of the first insulating pattern is positioned at a higher level than an upper surface of the first plating layer.

3. The FPCB of claim 1, wherein a lower surface of the second insulating pattern is positioned at a lower level than a lower surface of the second plating layer.

4. The FPCB of claim 1, wherein the first insulating pattern is provided in a structure buried in the first region of the first plating layer, and
wherein the second insulating pattern is provided on some region of the second plating layer.

5. The FPCB of claim 1, wherein the first insulating pattern is overlapped with the second insulating pattern in the vertical direction of the base.

6. The FPCB of claim 5, wherein the first insulating pattern and the second insulating pattern are provided at a bending region.

7. The FPCB of claim 6, wherein the first insulating pattern and the second insulating pattern are provided in a range not overlapped with a boundary line of the bending region.

8. The FPCB of claim 1, wherein the first plating layer is thinner than the first insulating pattern, and
wherein the second plating layer is thinner than the second insulating pattern.

9. The FPCB of claim 1, wherein the first sub-plating layer is provided in the first region and the second region, and the second sub-plating layer is provided in the second region and on the first sub-plating layer.

10. The FPCB of claim 1, wherein the first sub-plating layer and the second sub-plating layer include different materials.

11. The FPCB of claim 10, wherein the first sub-plating layer and the second sub-plating layer have different contents of tin (Sn).

12. The FPCB of claim 1, wherein the first plating layer and the second plating layer include a common material.

13. The FPCB of claim 1, wherein the thickness of the second region of the first plating layer is greater than a thickness of the second plating layer.

14. The FPCB of claim 1, wherein the base is a chip on film (COF) base, and the first insulating pattern has a structure buried in the first plating layer.

15. The FPCB of claim 14, wherein the first metal layer and the second metal layer constitute at least one circuit pattern.

16. The FPCB of claim 1, wherein a width of the first insulating pattern is equal to a width of the second insulating pattern.

17. The FPCB of claim 1,
wherein the first region of the first plating layer where the first insulating pattern is provided and third region of the second plating layer where the second insulating pattern is provided have different thicknesses.

18. The FPCB of claim 1, wherein a first distance between the first insulating pattern and the base is different from a second distance between the second insulating pattern and the base.

19. The FPCB of claim 1, wherein the first sub-plating layer and the second plating layer include a material of an alloy structure with the first metal layer and the second metal layer on surfaces of the first metal layer and the second metal layer.

20. A display device comprising the FPCB of claim 1, wherein the first insulating pattern is provided at a portion in a bent structure where a change of tensile force is relatively large, and
wherein the second insulating pattern is provided at another portion in the bent structure where a change of tensile force is relatively small.

* * * * *